United States Patent [19]

Mullarkey

[11] Patent Number: 5,793,691

[45] Date of Patent: Aug. 11, 1998

[54] MEMORY DEVICE WITH MOS TRANSISTORS HAVING BODIES BIASED BY TEMPERATURE-COMPENSATED VOLTAGE

[75] Inventor: Patrick J. Mullarkey, Meridian, Id.

[73] Assignee: Micron Technology, Inc., Boise, Id.

[21] Appl. No.: 785,824

[22] Filed: Jan. 9, 1997

Related U.S. Application Data

[63] Continuation of Ser. No. 515,126, Aug. 15, 1995, Pat. No. 5,602,790.

[51] Int. Cl.[6] ................................................. H03K 19/0175
[52] U.S. Cl. .................... 365/211; 365/212; 365/189.09; 326/31; 326/32; 326/33
[58] Field of Search ........................... 365/212, 189.09; 326/31, 32, 33, 34; 257/368

[56] References Cited

U.S. PATENT DOCUMENTS

| 5,391,980 | 2/1995 | Thiel et al. | 323/314 |
|---|---|---|---|
| 5,422,507 | 6/1995 | Wanlass | 257/355 |
| 5,589,794 | 12/1996 | McClure | 327/538 |
| 5,594,373 | 1/1997 | McClure | 327/108 |
| 5,602,790 | 2/1997 | Mullarkey | 365/211 |
| 5,646,516 | 7/1997 | Tobita | 323/313 |

Primary Examiner—Viet Q. Nguyen
Attorney, Agent, or Firm—Seed and Berry LLP

[57] ABSTRACT

A memory device includes a plurality of PMOS transistors and a voltage regulator circuit. Each transistor has a gate, a source region, a drain region, and a well containing the source and drain regions. Each transistor is characterized by a threshold voltage which is dependent on temperature and on a body-source bias voltage. Each transistor is also characterized by a sub-threshold current which is dependent on the transistor's threshold voltage. The voltage regulator circuit is operatively coupled to each well to provide the body-source bias voltage to each well. The voltage regulator circuit temperature-compensates the body-source bias voltage to maintain the threshold voltage of each transistor approximately constant despite changes in temperature. The memory device thus advantageously has a relatively constant stand-by current despite temperature variations.

32 Claims, 2 Drawing Sheets

MEMORY DEVICE WITH MOS TRANSISTORS HAVING BODIES BIASED BY TEMPERATURE-COMPENSATED VOLTAGE

CROSS-REFERENCE TO RELATED APPLICATION

This application is a continuation of U.S. patent application Ser. No. 08/515,126, filed Aug. 15, 1995, now U.S. Pat. No. 5,602,790.

FIELD OF THE INVENTION

This invention relates in general to memory devices, and in particular to memory devices having biased MOS transistor bodies.

BACKGROUND OF THE INVENTION

Modern memory devices such as dynamic random access memories (DRAMs) are often implemented with CMOS transistors. A common arrangement for one of these memory devices is to use NMOS transistors for memory cells in a memory array of the memory device and to use PMOS transistors for support circuitry in the periphery of the memory array.

It is well known that the magnitude of the threshold voltages $V_t$ of PMOS transistors can decrease by approximately 4 mV for every 1° C. rise in the operating temperature of the transistors. Thus, for example, the magnitude of the threshold voltage $V_t$ of a PMOS transistor used in a DRAM can decrease by approximately 0.28 V within a typical operating range of 0° to 70° C. It is also well known that PMOS transistors have sub-threshold currents $I_{Dst}$ which rise exponentially during operation as the magnitude of a gate-source voltage $V_{GS}$ rises toward the threshold voltage $V_t$. Thus, the sub-threshold current $I_{Dst}$ of a PMOS transistor can be larger at, for example, 70° C. than it is at 0° C. with the same gate-source voltage $V_{GS}$ being applied at 70° C. and at 0° C. because the magnitude of the threshold voltage $V_t$ is greater at 70° C. than it is at 0° C. As a result, since DRAM memory devices are characterized in a stand-by mode by a stand-by current which includes the sub-threshold currents $I_{Dst}$, DRAM memory devices using PMOS transistors can have an acceptable stand-by current at, for example, 0° C. and an excessive stand-by current at, for example, 70° C.

This problem of excessive stand-by current at higher temperatures is exacerbated by modern methods for improving the speed of PMOS transistors. One method involves shortening the length of the channel in order to decrease the gate capacitance to increase switching speed. Another method involves adding more boron to the channel and decreasing the arsenic in the wells in order to lower their junction capacitances and increase their switching speed. Unfortunately, both of these methods also decrease the magnitude of the threshold voltage $V_t$ of PMOS transistors and thereby increase their sub-threshold currents $I_{Dst}$.

Therefore, there is a need in the art for a memory device which has a relatively constant stand-by current despite temperature variations.

SUMMARY OF THE INVENTION

The present invention provides a memory device comprising at least one MOS transistor and a voltage regulator circuit. The transistor has a gate, a source region, a drain region, and a body containing the source and drain regions. The source and drain regions are one of either p-type or n-type, and the body is the other of either p-type or n-type. The transistor is characterized by a threshold voltage which is dependent on temperature and on a body-source bias voltage. Each transistor is also characterized by a sub-threshold current which is dependent on the transistor's threshold voltage. The voltage regulator circuit is operatively coupled to the body to provide the body-source bias voltage to the body. The voltage regulator circuit is constructed to temperature-compensate the body-source bias voltage to maintain the threshold voltage approximately constant despite changes in temperature.

In another embodiment, the present invention provides a method for operating at least one MOS transistor in a memory device. The method comprises: applying a body-source bias voltage between a body and a source region of the transistor; applying a stand-by drain-source voltage between a drain region and the source region of the transistor during a stand-by mode of the memory device; applying a stand-by gate-source voltage between a gate and the source region of the transistor during the stand-by mode of the memory device; and adjusting the body-source bias voltage to compensate for changes in the stand-by current of the transistor due to changes in temperature and to thereby maintain the stand-by current below a maximum amount.

The present invention thus advantageously provides a memory device which has a relatively constant stand-by current despite temperature variations because the body-source bias voltage applied to the MOS transistor of the memory device is temperature-compensated.

DETAILED DESCRIPTION OF THE INVENTION

Figure 1:
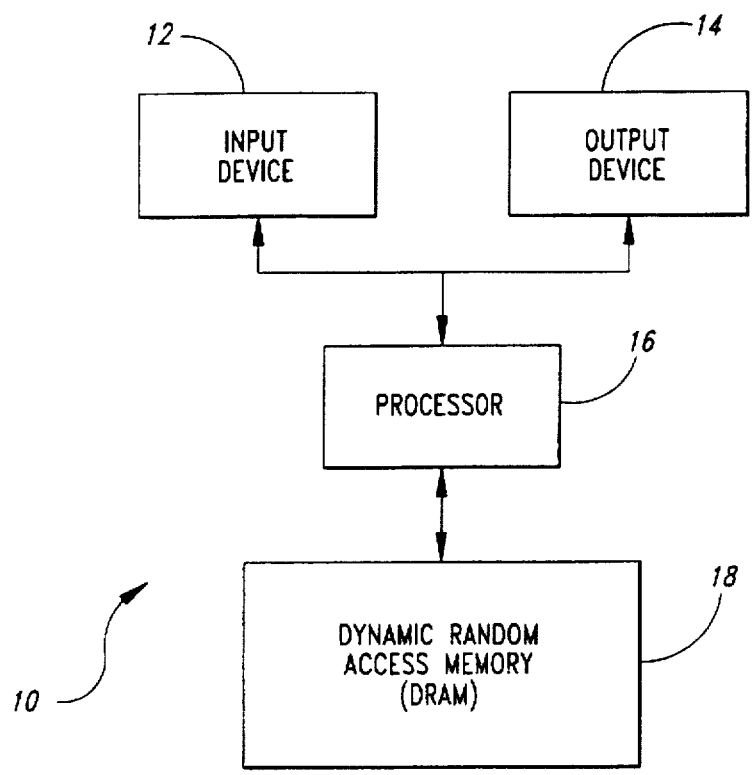
FIG. 1 is a block diagram of a preferred computer system according to the present invention.

As shown in FIG. 1, a preferred embodiment of the present invention comprises a computer system 10 including an input device 12 such as a keyboard and an output device 14 such as a computer monitor, both operatively coupled to a processor 16. The preferred computer system 10 also includes a memory device such as a dynamic random access memory (DRAM) 18 operatively coupled to the processor 16. Although the present invention will be described with respect to a DRAM, those having skill in the field of this invention will understand that the present invention is applicable to any memory device having MOS transistors.

Figure 2:
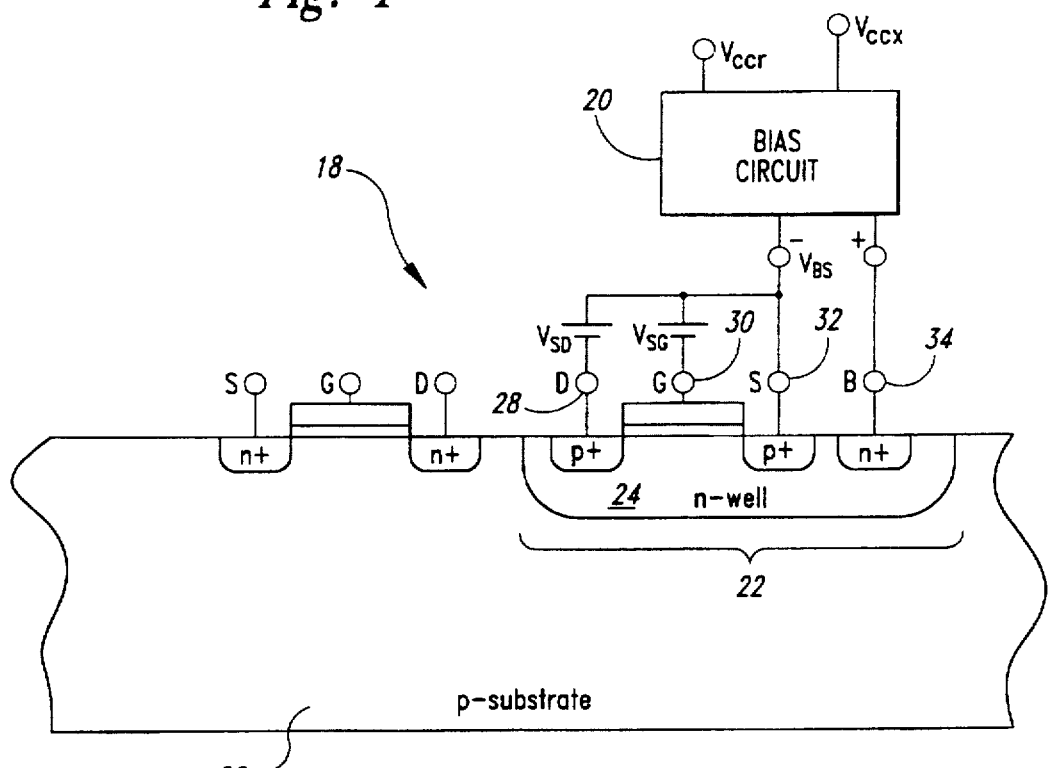
FIG. 2 is a side view of a MOS transistor and a block diagram of a bias circuit of a dynamic random access memory of the preferred computer system of FIG. 1.

The DRAM 18 of FIG. 1 is shown in more detail in FIG. 2. The DRAM 18 includes a bias circuit 20 operatively coupled to a plurality of MOS transistors, such as a PMOS transistor 22. The PMOS transistor 22 is constructed in the known manner with a body such as an n-well 24 implanted in a p-substrate 26. The PMOS transistor 22 includes a drain terminal 28, a gate terminal 30, a source terminal 32, and a body terminal 34. Although the present invention will be described with respect to the PMOS transistor 22 implemented in the n-well 24, it will be understood that the present invention is also applicable to PMOS transistors implemented in an n-substrate and to NMOS transistors implemented in a p-substrate such as the p-substrate 26.

The bias circuit 20 provides a body-source bias voltage $V_{BS}$ to the PMOS transistor 22 which is temperature-compensated so that a decrease in the magnitude of the threshold voltage $V_t$ of the PMOS transistor 22 due to a temperature increase is compensated for by an increase in the magnitude of the threshold voltage $V_t$ due to a change in the body-source bias voltage $V_{BS}$. The bias circuit 20 is described in more detail below with respect to FIGS. 3A, 3B and 4.

Figure 3A:
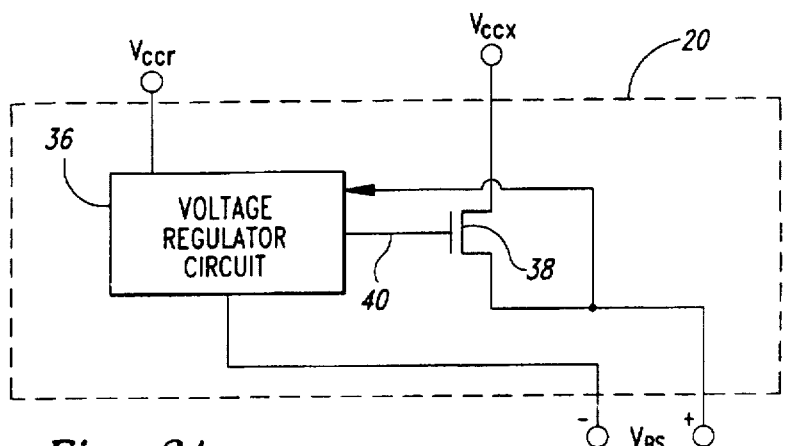
FIGS. 3A and 3B are block and schematic diagrams of the preferred bias circuit of FIG. 2.

One version of the bias circuit 20 of FIG. 2 is shown in more detail in FIG. 3A. The bias circuit 20 includes a temperature-compensated voltage regulator circuit 36 operatively coupled to a switching device, such as an NMOS transistor 38. The voltage regulator circuit 36 senses the level of the body-source bias voltage $V_{BS}$ being provided by the bias circuit 20 and, when necessary, provides a control signal 40 to the NMOS transistor 38 in order to turn the NMOS transistor 38 on and raise the body-source bias voltage $V_{BS}$.

Figure 3B:
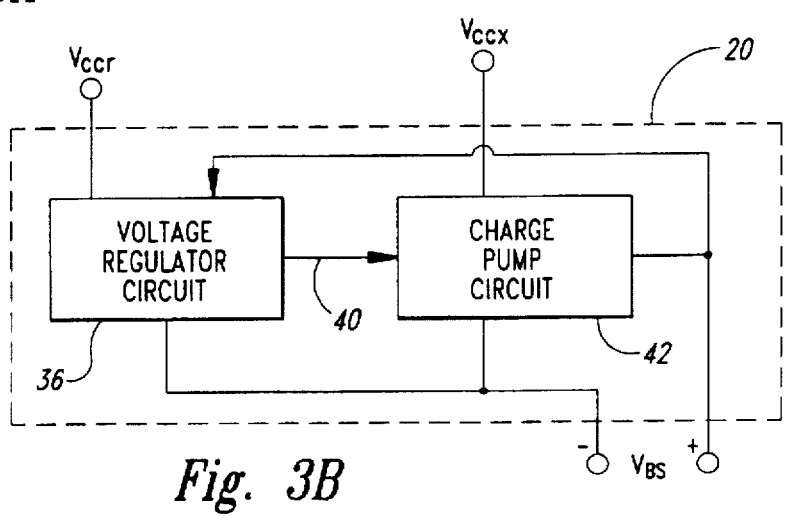

A preferred version of the bias circuit 20 of FIG. 2 is shown in FIG. 3B. The preferred bias circuit 20 includes the temperature-compensated voltage regulator circuit 36 operatively coupled to a conventional charge pump circuit 42. The voltage regulator circuit 36 senses the level of the body-source bias voltage $V_{BS}$ being provided by the bias circuit 20 and, when necessary, provides a control signal 40 to the charge pump circuit 42 directing the charge pump circuit 42 to increase the body-source bias voltage $V_{BS}$.

Figure 4:
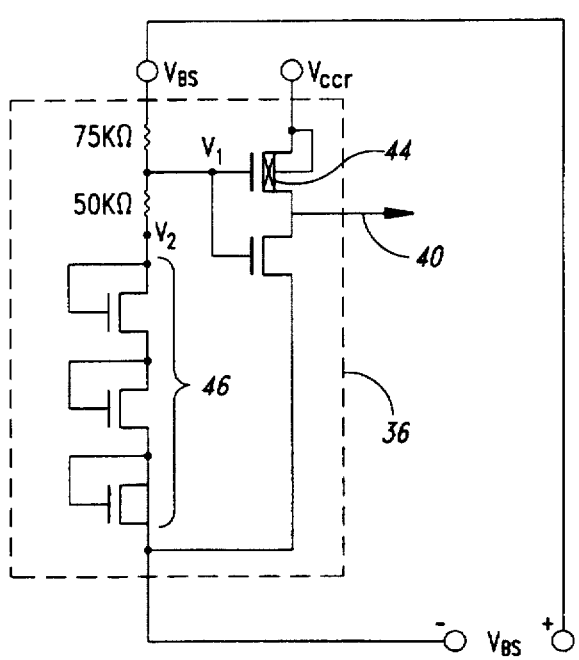
FIG. 4 is a schematic diagram of a voltage regulator circuit of FIGS. 3A and 3B.

The voltage regulator circuit 36 of FIGS. 3A and 3B is shown in more detail in FIG. 4. In operation, the voltage regulator circuit 36 provides the control signal 40 at a supply voltage $V_{ccr}$ when a gate voltage $V_1$ is less than the supply voltage $V_{ccr}$ minus the magnitude of the threshold voltage $V_t$ of a PMOS transistor 44.

If, for example, the supply voltage $V_{ccr}$ is 3.3 V, then at 25° C. the threshold voltage $V_t$ of the PMOS transistor 44 is approximately −0.5 V. Consequently, the gate voltage $V_1$ turns the PMOS transistor 44 on at voltages less than approximately 2.8 V. Since at 25° C. the threshold voltages $V_t$ of a plurality of NMOS transistors 46 are approximately 0.75 V each, a total voltage drop $V_2$ across the NMOS transistors 46 is approximately 2.25 V. Thus, the voltage regulator circuit 36 continues to provide the control signal 40 until the body-source voltage VBS reaches approximately 3.63 V, at which time the gate voltage $V_1$ exceeds 2.8 V and the control signal 40 is turned off.

If the temperature then increases to 85° C., the threshold voltage $V_t$ of the PMOS transistor 44 is approximately −0.3 V. Consequently, the gate voltage $V_1$ turns the PMOS transistor 44 on at voltages less than approximately 3.0 V. Since at 85° C. the threshold voltages $V_t$ of the NMOS transistors 46 are approximately 0.65 V each, the total voltage drop $V_2$ across the NMOS transistors 46 is approximately 1.95 V. Thus, the voltage regulator circuit 36 continues to provide the control signal 40 until the body-source voltage $V_{BS}$ reaches approximately 4.58 V, at which time the gate voltage $V_1$ exceeds 3.0 V and the control signal 40 is turned off.

In this example, the body-source voltage $V_{BS}$ reached at 25° C. (3.63 V) and at 85° C. (4.58 V) is designed to compensate for the change in the threshold voltage Vt of the PMOS transistor 22 (not shown) due to the change in temperature from 25° C. to 85° C. It will be understood that a wide variety of modifications can be made to the voltage regulator circuit 36 in order to provide the temperature compensation appropriate to a particular memory device.

The present invention thus advantageously provides a memory device which has a relatively constant stand-by current despite temperature variations because the body-source bias voltage applied to the MOS transistors of the memory device is temperature-compensated. Such a memory device is particularly advantageous in portable applications where a low stand-by current for a memory device is particularly desirable.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

I claim:

1. In an integrated circuit having at least one field effect transistor of the type having a gate, a source, a drain, and a body containing the source and drain, the source and drain being one of either p-type or n-type and the body being the other of either p-type or n-type, the transistor having a gate-to-source threshold voltage that is a function of the temperature of the transistor, a method of reducing the effect of temperature on the gate-to-source threshold voltage, comprising:

providing a bias voltage between the source and the body of the transistor; and adjusting the magnitude of the bias voltage as a function of the temperature of the transistor.

2. The method of claim 1 wherein the steps of providing the bias voltage and adjusting the magnitude of the bias voltage comprise:

providing a second transistor of the same type as the transistor that is to be temperature compensated;

exposing the second transistor to substantially the same temperature as the transistor that is to be temperature compensated;

comparing a predetermined percentage of the bias voltage to a fixed voltage less the threshold voltage of the second transistor; and adjusting the magnitude of the bias voltage as a function of the comparison between the predetermined percentage of the bias voltage and the a fixed voltage less the threshold voltage of the second transistor.

3. The method of claim 1 wherein the step of adjusting the magnitude of the bias voltage comprises:

increasing the bias voltage when a predetermined percentage of the bias voltage is less than the fixed voltage less the threshold voltage of the second transistor; and decreasing the bias voltage when a predetermined percentage of the bias voltage is less than the fixed voltage less the threshold voltage of the second transistor.

4. The method of claim 3 wherein the steps of increasing and decreasing the bias voltage comprise:

providing a charge pump adapted to generate an output voltage that, when enabled, changes magnitude in a predetermined direction;

enabling the charge pump when a predetermined percentage of the bias voltage is less than the fixed voltage less the threshold voltage of the second transistor; and disabling the charge pump when a predetermined percentage of the bias voltage is greater than the fixed voltage less the threshold voltage of the second transistor.

5. The method of claim 1 wherein the field effect transistor comprises a metal-oxide-silicon ("MOS") field effect transistor.

6. The method of claim 5 wherein the MOS field effect transistor comprises a PMOS field effect transistor.

7. The method of claim 1 wherein the step of adjusting the magnitude of the bias voltage comprises:
   increasing the bias voltage as the temperature of the transistor increases; and
   decreasing the bias voltage as the temperature of the transistor decreases.

8. The method of claim 1 wherein the integrated circuit comprises a memory device.

9. In an integrated circuit having at least one field effect transistor of the type having a gate, a source, a drain, and a body containing the source and drain, the source and drain being one of either p-type or n-type and the body being the other of either p-type or n-type, the transistor having a sub-threshold current that is a function of the temperature of the transistor, a method of reducing the effect of temperature on the sub-threshold current, comprising:
   providing a bias voltage between the source and the body of the transistor; and
   adjusting the magnitude of the bias voltage as a function of the temperature of the transistor.

10. The method of claim 9 wherein the steps of providing the bias voltage and adjusting the magnitude of the bias voltage comprise:
    providing a second transistor having a gate-to-source threshold voltage that is a function of the temperature of the second transistor;
    exposing the second transistor to substantially the same temperature as the transistor that is to be temperature compensated;
    comparing a predetermined percentage of the bias voltage to a fixed voltage less the threshold voltage of the second transistor; and
    adjusting the magnitude of the bias voltage as a function of the comparison between the predetermined percentage of the bias voltage and the a fixed voltage less the threshold voltage of the second transistor.

11. The method of claim 9 wherein the step of adjusting the magnitude of the bias voltage comprises:
    increasing the bias voltage when a predetermined percentage of the bias voltage is less than the fixed voltage less the threshold voltage of the second transistor; and
    decreasing the bias voltage when a predetermined percentage of the bias voltage is less than the fixed voltage less the threshold voltage of the second transistor.

12. The method of claim 11 wherein the steps of increasing and decreasing the bias voltage comprise:
    providing a charge pump adapted to generate an output voltage that, when enabled, changes magnitude in a predetermined direction;
    enabling the charge pump when a predetermined percentage of the bias voltage is less than the fixed voltage less the threshold voltage of the second transistor; and
    disabling the charge pump when a predetermined percentage of the bias voltage is greater than the fixed voltage less the threshold voltage of the second transistor.

13. The method of claim 9 wherein the field effect transistor comprises a metal-oxide-silicon ("MOS") field effect transistor.

14. The method of claim 13 wherein the MOS field effect transistor comprises a PMOS field effect transistor.

15. The method of claim 9 wherein the step of adjusting the magnitude of the bias voltage comprises:
    increasing the bias voltage as the temperature of the transistor increases; and
    decreasing the bias voltage as the temperature of the transistor decreases.

16. The method of claim 9 wherein the integrated circuit comprises a memory device.

17. An integrated circuit comprising:
    at least one field effect transistor having a gate, a source, a drain, and a body containing the source and the drain, the source and drain being one of either p-type or n-type and the body being the other of either p-type or n-type, the transistor having a gate-to-source threshold voltage that is a function of the temperature of the transistor; and
    a voltage regulator providing a bias voltage between the source and the body of the transistor, the voltage regulator being adapted to adjust the magnitude of the bias voltage as a function of the temperature of the transistor.

18. The integrated circuit of claim 17 wherein the voltage regulator comprises:
    a second transistor of the same type and exposed to substantially the same temperature as the transistor to which the bias voltage is provided;
    a comparator coupled to the second transistor, the comparator comparing a predetermined percentage of the bias voltage to a fixed voltage less the threshold voltage of the second transistor; and
    a voltage generator coupled to the comparator and generating the bias voltage, the voltage generator causing the magnitude of the bias voltage as a function of the comparison between the predetermined percentage of the bias voltage and the a fixed voltage less the threshold voltage of the second transistor.

19. The integrated circuit of claim 17 wherein the voltage regulator increases the bias voltage when a predetermined percentage of the bias voltage is less than the fixed voltage less the threshold voltage of the second transistor and decreases the bias voltage when a predetermined percentage of the bias voltage is less than the fixed voltage less the threshold voltage of the second transistor.

20. The integrated circuit of claim 17 wherein the voltage regulator comprises:
    a charge pump adapted to generate at an output terminal an output voltage that changes magnitude in a predetermined direction responsive to an enable signal applied to an enable input, the output terminal being coupled to the body of the transistor; and
    a second transistor of the same type and exposed to substantially the same temperature as the transistor to which the bias voltage is provided, the source of the second transistor being coupled to a reference voltage, the gate of the second transistor being coupled to the bias voltage, and the drain of the second transistor being coupled to the enable input terminal of the charge pump.

21. The integrated circuit of claim 17 wherein the field effect transistor comprises a metal-oxide-silicon ("MOS") field effect transistor.

22. The integrated circuit of claim 21 wherein the MOS field effect transistor comprises a PMOS field effect transistor.

23. The integrated circuit of claim 17 wherein the voltage regulator increases the bias voltage as the temperature of the transistor increases and decreases the bias voltage as the temperature of the transistor decreases.

24. The integrated circuit of claim 17 wherein the integrated circuit comprises a memory device.

25. An integrated circuit comprising:

at least one field effect transistor having a gate, a source, a drain, and a body containing the source and the drain, the source and drain being one of either p-type or n-type and the body being the other of either p-type or n-type, the transistor having a gate-to-source threshold voltage that is a function of the temperature of the transistor; and bias means for applying a bias voltage between the source and the body of the transistor, the magnitude of the bias voltage being a function of the temperature of the transistor.

26. The integrated circuit of claim 25 wherein the bias means comprise:

means for increasing the bias voltage as the temperature of the transistor increases; and means for decreasing the bias voltage as the temperature of the transistor decreases.

27. The integrated circuit of claim 25 wherein the bias means comprise:

a charge pump adapted to generate at an output terminal an output voltage that changes magnitude in a predetermined direction responsive to an enable signal applied to an enable input, the output terminal being coupled to the body of the transistor; and control means coupled to the enable input of the charge pump for providing the enable signal as a function of the temperature of the transistor.

28. The integrated circuit of claim 27 wherein the control means comprise a second transistor of the same type and exposed to substantially the same temperature as the transistor to which the bias voltage is provided, the source of the second transistor being coupled to a reference voltage, the gate of the second transistor being coupled to the bias voltage, and the drain of the second transistor being coupled to the enable input terminal of the charge pump.

29. The integrated circuit of claim 25 wherein the bias means comprise:

a charge pump adapted to generate an output voltage that, when enabled, changes magnitude in a predetermined direction;

means for enabling the charge pump when a predetermined percentage of the bias voltage is less than the fixed voltage less the threshold voltage of the second transistor; and means for disabling the charge pump when a predetermined percentage of the bias voltage is greater than the fixed voltage less the threshold voltage of the second transistor.

30. The integrated circuit of claim 25 wherein the field effect transistor comprises a metal-oxide-silicon ("MOS") field effect transistor.

31. The integrated circuit of claim 30 wherein the MOS field effect transistor comprises a PMOS field effect transistor.

32. The integrated circuit of claim 25 wherein the integrated circuit comprises a memory device.

* * * * *

UNITED STATES PATENT AND TRADEMARK OFFICE
CERTIFICATE OF CORRECTION

PATENT NO. : 5,793,691
DATED : August 11, 1998
INVENTOR(S) : Patrick J. Mullarkey It is certified that error appears in the above-identified patent and that said Letters Patent is hereby corrected as shown below:

Column 3, Line 47    "VBS"            -- $V_{BS}$ --

Signed and Sealed this

First Day of May, 2001

Attest:

NICHOLAS P. GODICI

Attesting Officer      Acting Director of the United States Patent and Trademark Office